(12) United States Patent
Joshi

(10) Patent No.: US 6,798,044 B2
(45) Date of Patent: Sep. 28, 2004

(54) FLIP CHIP IN LEADED MOLDED PACKAGE WITH TWO DIES

(75) Inventor: Rajeev Joshi, Cupertino, CA (US)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 09/730,932

(22) Filed: Dec. 4, 2000

(65) Prior Publication Data

US 2002/0066950 A1 Jun. 6, 2002

(51) Int. Cl.[7] .............................................. H01L 23/495
(52) U.S. Cl. .......................... 257/666; 257/787; 257/777
(58) Field of Search .............................. 257/666, 778, 257/685, 686, 777, 787

(56) References Cited

U.S. PATENT DOCUMENTS

| | | | |
|---|---|---|---|
| 5,313,095 A | * 5/1994 | Tagawa et al. | |
| 5,319,242 A | 6/1994 | Carney et al. | |
| 5,637,916 A | 6/1997 | Joshi | |
| 5,765,280 A | 6/1998 | Joshi | |
| 5,789,809 A | 8/1998 | Joshi | |
| 6,075,284 A | * 6/2000 | Choi et al. | |
| 6,133,634 A | 10/2000 | Joshi | |
| 6,184,573 B1 | * 2/2001 | Pu | |
| 6,225,683 B1 | * 5/2001 | Yalananchiili et al. | |
| 6,294,403 B1 | 9/2001 | Joshi | |
| 6,303,981 B1 | * 10/2001 | Moden | |
| 6,313,520 B1 | * 11/2001 | Yoshida et al. | |
| 6,316,822 B1 | * 11/2001 | Venateshwaran et al. | |
| 6,380,615 B1 | * 4/2002 | Park et al. | |
| 6,469,384 B2 | 10/2002 | Joshi | |
| 6,489,678 B1 | 12/2002 | Joshi | |
| 6,566,749 B1 | 5/2003 | Joshi et al. | |
| 6,627,991 B1 | 9/2003 | Joshi | |
| 6,633,030 B2 | 10/2003 | Joshi | |
| 6,661,082 B1 | 12/2003 | Granada et al. | |
| 6,683,375 B2 | 1/2004 | Joshi et al. | |
| 2002/0066950 A1 | 6/2002 | Joshi | |
| 2002/0066959 A1 | 6/2002 | Joshi et al. | |
| 2002/0100962 A1 | 8/2002 | Joshi | |
| 2002/0192935 A1 | 12/2002 | Joshi et al. | |
| 2003/0011005 A1 | 1/2003 | Joshi | |
| 2003/0042403 A1 | 3/2003 | Joshi | |
| 2003/0075786 A1 | 4/2003 | Joshi et al. | |
| 2003/0107126 A1 | 6/2003 | Joshi | |
| 2003/0122247 A1 | 7/2003 | Joshi | |
| 2003/0173684 A1 | 9/2003 | Joshi et al. | |
| 2003/0197278 A1 | 10/2003 | Joshi et al. | |

OTHER PUBLICATIONS

Joshi, et al.; U.S. pending Utility patent application No. 09/464,885; filed Dec. 16, 1999.

* cited by examiner

Primary Examiner—S. V. Clark
(74) Attorney, Agent, or Firm—Townsend and Townsend and Crew LLP

(57) ABSTRACT

A chip device including two stacked dies. The chip device includes a leadframe that includes a plurality of leads. A first die is coupled to a first side of the leadframe with solder and a second die is coupled to a second side of the leadframe with solder. A molded body surrounds at least a portion of the leadframe and the dies.

8 Claims, 2 Drawing Sheets

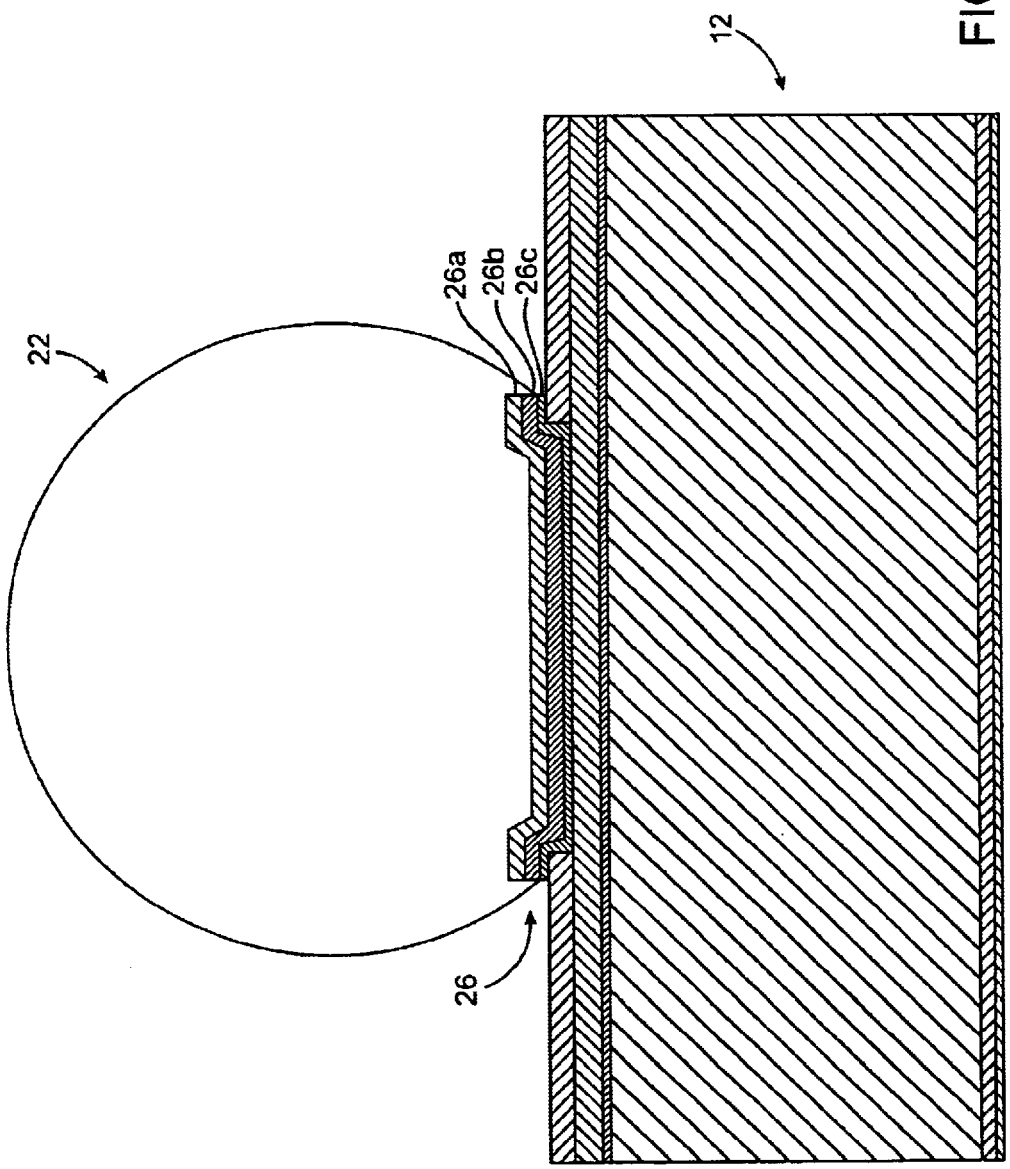

FLIP CHIP IN LEADED MOLDED PACKAGE WITH TWO DIES

BACKGROUND OF THE INVENTION

1. Field of the Invention

The present invention relates to a flip chip in a leaded molded package, and more particularly, to a flip chip in a leaded molded package with two stacked dies.

2. Description of the Prior Art

Semiconductor devices are becoming smaller and smaller. Additionally, as the need for speed, power and capacity increases, such a reduction in size leads to a contradiction in that smaller devices often have smaller capabilities.

In order to create smaller devices but with increased capabilities, the prior art has attempted to stack dies on top of one another. However, the prior art currently uses wire bonding for its interconnect scheme, which leads to higher resistance and inductance and does not allow for as thin a package as desired. Additionally, using wire bond techniques does not allow for the drain regions of a power MOSFET die to be exposed.

SUMMARY OF THE INVENTION

The present invention provides a chip device that includes a leadframe or a substrate that includes a plurality of leads. A first die is flipped onto the leadframe and the leadframe and die are then flipped together. A second die is then flipped onto the leadframe. The two dies are coupled to the leadframe with solder bumps. A molded body is placed around the dies and the leadframe such that the drain area of at least the first die is exposed.

In accordance with one aspect of the present invention, the first die is attached to the leadframe with a higher temperature reflow process while the second die is attached to the leadframe using a lower temperature reflow process.

In accordance with another aspect of the present invention, the first die of the chip device is a MOSFET while the second die is a controller IC.

Thus, the present invention provides a chip device that includes two dies stacked atop one another. The use of solder bumps allows for a small profile package. In addition, the non-use of wire bond interconnect allows for accommodating a very large size die for a given molded package body outline. A die size in excess of 150% of the nominal wire bonded package size may be accommodated by this arrangement.

Other features and advantages of the present invention will be understood upon reading and understanding the detailed description of the preferred exemplary embodiments, found hereinbelow in conjunction with reference to the drawings in which like numerals represent like elements.

BRIEF DESCRIPTION OF THE DRAWINGS

FIG. 1A is a schematic side sectional view of a bumped die.

DETAILED DESCRIPTION OF THE PREFERRED EXEMPLARY EMBODIMENTS

Figure 1:
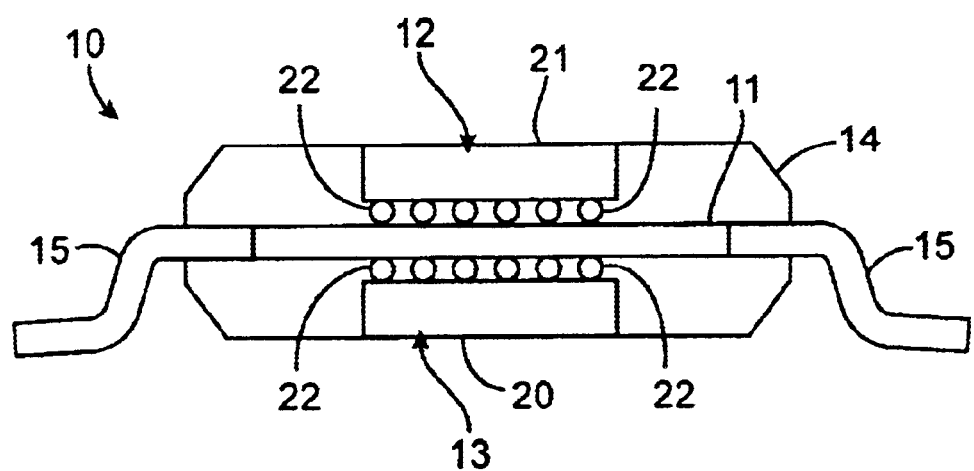
FIG. 1 is a side sectional view of a chip device in accordance with the present invention.

FIG. 1 provides a cross-sectional view of a chip device 10 with a leaded molded package in accordance with the present invention. The device includes a leadframe 11, two dies 12, 13 coupled to the leadframe and a molded body 14 placed around the coupled dies and leadframe. The leadframe includes a plurality of leads 15.

The chip device is preferably created by placing the leadframe "upside-down" and flipping first die 12 onto the backside of the leadframe. Preferably, the die is what is commonly referred to in the industry as a "bumped die." Alternatively, solder paste or solder bumps may be placed onto the leadframe prior to flipping the die thereon. The die is then attached to the leadframe with a high temperature reflow process.

First die 12 is preferably a one-piece item that is often referred to in the art as a "bumped die." As can be seen in FIG. 1A, a bumped die includes first die 12, "under bump material" that serves as an intermediate layer 26 between the top surface of the die and solder bump 22, and the solder bumps themselves. Preferably, the under bump material is one of TiW, Cu, Au or an equivalent. In the example illustrated in FIG. 1A, the under bump material is broken into three layers—Cu plating 26a, sputtered Cu 26b and sputtered Ti 26d.

The leadframe with the first die coupled thereto is then flipped. Second die 13 is then attached to the top side of the leadframe. Once again, the second die is preferably a bumped die. Alternatively, solder bumps or solder paste may be placed onto the leadframe prior to placing the die thereon. In order to avoid the first die solder from reflowing, a lower temperature reflow process is used to reflow the solder between the second die and the leadframe. The "higher" temperature solder preferably has a melting around point 310° C., and could be for example, 95/5 Pb/Sn. The "lower" temperature solder Sn/Sb having a melting point around are 250° C.

Molded body 14 is then placed around the leadframe and the dies coupled thereto. Preferably, drain region 20 of the second die is exposed through the body. Additionally, back side of the first die may be exposed through the top of the body where an optional heat sink may be attached for further improved heat dissipation.

Thus, the manufacturing process may be used to produce high density packaging, when a higher cell density silicon is not available, or when the higher cell density silicon die size is so large that it will not fit into a small package. In memory devices, a mirror image of two identical dies being stacked together creates a higher density memory cell with a smaller footprint. In intelligent load switches (ILS), a higher pin IC may be effectively combined with a three-terminal MOSFET to produce a package with the smallest number of pins (smallest package) as the drain region of the MOSFET may be connected to the printed circuit board (PCB) directly due to the draining region being exposed through the bottom of the body, thus, directly saving I/O pins on the package. A high current intelligent load switch may therefore be constructed that has the dual advantage of small footprint and very superior thermal performance.

Additionally, the present invention may be used to create a chip device arrangement where a controller IC is combined with a MOSFET in a small package outline, thus forming the intelligent load switch. Since the backside (drain) region of first die 12, the MOSFET, is exposed, it may be attached directly to the PCB to provide a good thermal path and a low resistance drain contact. The arrangement saves a couple of I/O pins that allows the package to have a low I/O count, thus reducing its size. Connections between the IC's and the MOSFET's source and gate may be accomplished easily by routing the leadframe as needed, facilitating a low-resistance (high current) connection.

The use of solder bumps in the chip device also contributes to the small profile package (either through use of solder bumps directly or through use of a bumped die), e.g., each die may be 8 mils thick, the solder bumps may be 6 mils, the leadframe about 6 mils, and the molded body about 6 mils, thus giving a total package height of approximately 34 mils (0.8 mm). In addition, the non-use of wire bond interconnect allows for accommodating a very large size die for a given molded package.

Although the invention has been described with reference to specific exemplary embodiments, it will appreciated that it is intended to cover all modifications and equivalents within the scope of the appended claims.

What is claimed is:

1. A chip device comprising:
   a. a single, common leadframe comprising a base and a plurality of leads extending therefrom:
   b. a first die coupled to a first side of the base with solder;
   c. a second die coupled to the second side of the base opposite the first side with solder; and
   d. a molded body surrounding at least a portion of the leadframe and the dies, wherein a drain region of the first die is exposed through the molded body.

2. A chip device comprising:
   (a) a single leadframe comprising a base and a plurality of leads extending therefrom;
   (b) a first die comprising a first backside coupled to a first side of the base with a first solder material;
   (c) a second die comprising a second backside is coupled to the second side of the base opposite the first side of the base, wherein the second die is coupled to the second side of the base with a second solder material; and
   (d) a molded body surrounding at least a portion of the leadframe, the first die, and the second side, wherein the first backside of the first die and the second backside of the second die are exposed through the molded body and are substantially coplanar with external surfaces of the molded body, and wherein the second backside forms a drain contact for a MOSFET in the second die.

3. The chip device of claim 2 wherein the first die comprises a controller IC.

4. The chip device of claim 2 wherein the first die comprises a MOSFET.

5. The chip device of claim 2 wherein the first and second dies each comprise an underbump material.

6. The chip device of claim 2 further comprising a heat sink coupled to the exposed first backside of the first die.

7. The chip device of claim 2 wherein the first solder material and the second solder material are different and have different reflow temperatures.

8. The chip device of claim 7 wherein the first solder material comprises solder with a melting temperature of about 310° C. and the second solder material comprises a melting temperature of about 250° C.

* * * * *